(12) United States Patent
McCarthy et al.

(10) Patent No.: US 8,304,867 B2
(45) Date of Patent: Nov. 6, 2012

(54) CRACK ARREST VIAS FOR IC DEVICES

(75) Inventors: Robert Fabian McCarthy, Dallas, TX (US); Stanley Craig Beddingfield, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 12/917,144

(22) Filed: Nov. 1, 2010

(65) Prior Publication Data

US 2012/0104604 A1 May 3, 2012

(51) Int. Cl.
*H01L 23/495* (2006.01)
(52) U.S. Cl. ........ 257/669; 257/673; 257/727; 257/780; 257/786; 257/E23.169
(58) Field of Classification Search .................. 257/669, 257/673, 727, 780, 786
See application file for complete search history.

(56) References Cited

U.S. PATENT DOCUMENTS

| | | | | |
|---|---|---|---|---|
| 6,462,414 | B1 * | 10/2002 | Anderson | 257/738 |
| 8,084,871 | B2 * | 12/2011 | Rahim et al. | 257/784 |
| 2002/0185721 | A1 | 12/2002 | Hwang et al. | |
| 2006/0226542 | A1 * | 10/2006 | Chien et al. | 257/737 |
| 2009/0278263 | A1 | 11/2009 | McCarthy et al. | |
| 2009/0283903 | A1 | 11/2009 | Park | |
| 2010/0007011 | A1 * | 1/2010 | Hung et al. | 257/692 |

FOREIGN PATENT DOCUMENTS

KR 100790527 B1 1/2008
KR 1020100093357 A 8/2010

* cited by examiner

*Primary Examiner* — Wai Sing Louie
(74) *Attorney, Agent, or Firm* — Steven A. Shaw; W. James Brady; Frederick J. Telecky, Jr.

(57) ABSTRACT

An integrated circuit (IC) device includes a substrate having a top surface including active circuitry including a plurality of I/O nodes, and a plurality of die pads coupled to the plurality of I/O nodes. A first dielectric layer including first dielectric vias is over the plurality of die pads. A redirect layer (RDL) including a plurality of RDL capture pads is coupled to the plurality of die pads over the first dielectric vias. A second dielectric layer including second dielectric vias is over the plurality of RDL capture pads. At least one of the second dielectric vias is a crack arrest via that has a via shape that includes an apex that faces away from a neutral stress point of the IC die and is oriented along a line from the neutral stress point to the crack arrest via to face in a range of ±30 degrees from the line. Under bump metallization (UBM) pads are coupled to the plurality of RDL capture pads over the second dielectric vias, and metal bonding connectors are on the UBM pads.

9 Claims, 3 Drawing Sheets

| DESCRIPTION | BLR-TC | | |
|---|---|---|---|
| | FIRST FAIL | 5% FR | 63.2% FR |
| STANDARD CIRCULAR SECOND DIELECTRIC VIA DESIGN | 655 | 832 | 1580 |
| CRACK ARREST SECOND DIELECTRIC VIA DESIGN | 1528 | 1479 | 2345 |

CRACK ARREST VIAS FOR IC DEVICES

FIELD

Disclosed embodiments relate to integrated circuits (ICs), and more particularly to chip scale packages.

BACKGROUND

The demand for smaller, more portable electronic products with increased functionality has been fueling growth in many markets and applications. To provide these products, designers have been turning to reduced size packing methods such chip scale packages (CSPs). One particular implementation of CSPs, wafer CSPs (WCSPs), allows the package size to be reduced to the size of the die itself and eliminates the need for the larger interposer layer typical of larger CSPs.

WCSP eliminates conventional packaging steps such as die bonding, wire bonding, and die level flip chip attach processes to a package substrate by using the IC die itself as the WCSP substrate. Use of the die itself as the WCSP substrate significantly reduces the footprint to the IC die itself as compared to the same IC die attached to a larger footprint package substrate (e.g., PCB substrate).

WCSP can be embodied as direct-bump WCSP or redirect layer (RDL) WCSP which unlike direct-bump WCSP adds a RDL that functions as a rewiring layer to enable repositioning of the external input/output (I/O) terminals at desired positions. In a typical RDL WCSP production flow, after completion of conventional back end of the line (BEOL) wafer fab processing, the WCSP die generally includes die pads (also known as bond pads) and a dielectric passivation layer over the BEOL metal stack, except for passivation openings over the die pads. A first WCSP dielectric (e.g., a polyimide) is deposited. Lithography/etch forms first dielectric vias in the first WCSP dielectric over the die pads, followed by deposition and patterning of an RDL metal including a plurality of RDL traces which contact the die pads and extends laterally therefrom to RDL capture pads. A second WCSP dielectric (e.g., a polyimide) is then deposited and second dielectric vias formed that reach the RDL in RDL capture pad positions that are lateral to the position of the die pads. The first and second dielectric vias are both conventionally circular, or in some case square, in cross-sectional shape.

Under bump metallization (UBM) pads commonly referred to as "ball pads" or "bump pads" are formed over the second dielectric vias and are coupled to and generally enclosed by the RDL capture pads, followed by forming metal (e.g., solder) balls, pillars or other bonding connectors on the UBM pads. Each bonding connector, such as a solder ball, provides a repositioned external I/O connection for the WCSP die. The WCSP wafer is then singulated to form a plurality of singulated WCSP die, commonly for use on boards for portable devices where the board area is valuable.

One challenge for WCSP devices is reliability. Typically, board-level reliability (BLR) tests include temperature cycling (TC), drop, and bend testing. For BLR-TC, WCSPs are conventionally mounted onto organic printed circuit boards and subjected to TC, and the properties of the RDL and the solder balls, as well as the properties of any adhesion or diffusion barrier layers used therebetween, are evaluated. As the WCSP die size increases, the reliability which may be evidenced in an accelerated fashion during BLR-TC testing is known to decrease. BLR-TC performance for WCSP die has been conventionally addressed by implementing changes to the WCSP process and materials (e.g., alternative dielectrics), which have somewhat improved BLR-TC performance.

SUMMARY

The Inventors have recognized that conventional IC devices having I/Os comprising bonding conductors coupled by vias to metal pads, such as WCSPs, may not perform well in BLR-TC testing, or more generally during field use, due to distance to neutral stress point (NSP) related issues. Distance to NSP issues can result in a tendency for periphery I/Os on the die to fail at a higher rate during field use or BLR-TC testing as compared to non-periphery I/Os. Such failures for WCSP die have been recognized by the Inventors to occur due to fractures in the RDL pad at the second level dielectric via openings underneath the solder ball or other metal bonding connector. During circuit operation, the electrical resistance of the periphery I/Os increase as this fracture location propagates around this via opening, and can eventually result in electrical failures due to open circuits.

While changes to the WCSP process and materials have somewhat improved reliability including during BLR-TC performance, further reliability improvements to reduce failure rates are needed. Disclosed embodiments in contrast to conventional solution attempts involve modifying CSP design features that can be implemented without impact to process or materials, which have been found to significantly further improve WCSP reliability. Disclosed IC devices comprise a first dielectric layer including first dielectric vias over a plurality of die pads, a redirect layer (RDL) including a plurality of RDL capture pads coupled to the plurality of die pads over the first dielectric vias, and a second dielectric layer including second dielectric vias over the plurality of RDL capture pads. At least one second dielectric via is what is referred to herein as a "crack arrest via". Crack arrest vias have a via shape that includes an apex that faces away from the NSP on the IC die and is oriented along a line from the NSP to the crack arrest via to face (point) in a range of ±30 degrees from the line, and ±15 degrees from the line in one embodiment.

BLR-TC improvements provided by disclosed embodiments have been found to include (i) a reduction in incidence/density and size in second dielectric cracking/cracks due to more second dielectric material being between the RDL and the UBM because the crack arrest via shape lowers the overall stress profile by increasing amount of second dielectric between the bonding conductor (e.g., solder ball) and RDL pad as compared to conventional circular or square vias. In addition, BLR-TC improvements include (ii) for the limited number of second dielectric cracks that do form, deflection of such cracks away from the RDL pad by the orientation of the apex of the crack arrest via that points away from the line to the NSP functions to direct such cracks laterally away from the crack arrest via. Stress modeling and empirical data obtained by the Inventors both demonstrate that disclosed crack arrest vias improve reliability by increasing the average mean time to failure (MTF) and also improve BLR performance.

DETAILED DESCRIPTION

Figures 1, 4:
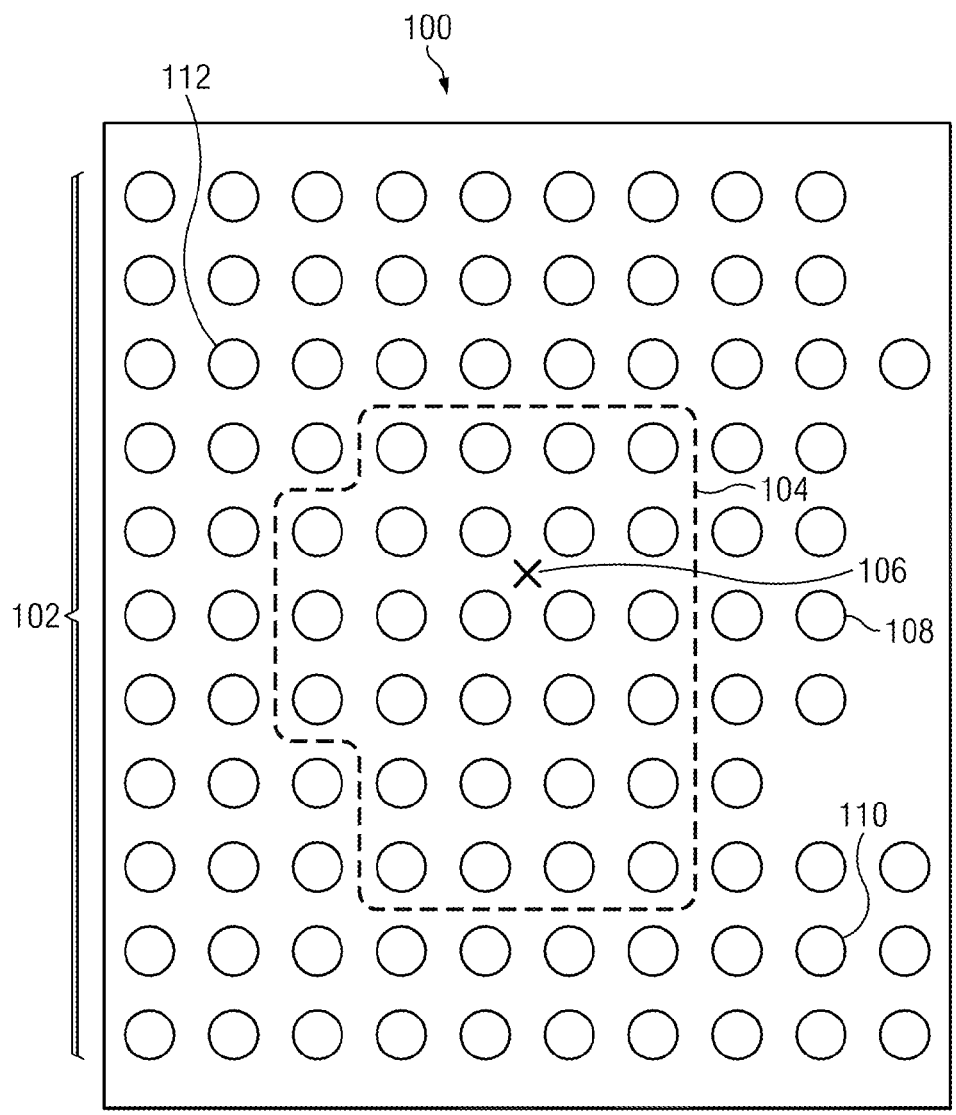
FIG. 1 shows an example stress distribution for pads on an example WCSP device.
FIG. 4 shows empirical results evidencing BLR improvements in TC performance for WCSP die having disclosed crack arrest vias as compared to conventional circular vias, according to disclosed embodiments.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

The Inventors have discovered that changes in processing and materials provide only limited improvements to WCSP device reliability. Moreover, the principal driver effecting reliability of WCSP devices, particularity for die sizes over 9 mm² with at least a large number of solder balls (e.g., >80) has been recognized to be stress induced by the differences in coefficient of thermal expansion (CTE) between the WCSP device and the PCB, particularly an organic PCB. As temperatures change the PCB may expand relative to the WCSP device, resulting in compressive and tensile forces in various layers in the WCSP die. In particular, such forces are increased for portions of the WCSP die closer to the edges of the die, increasing stress in such regions, especially in the vicinity of UBM pads (bump pads) of the WCSP die. Accordingly, as the distance of a UBM pad to the NSP, normally the center of a die, on the WCSP die is increased, the stress at the UBM pad is also increased, which the Inventors have recognized can lead to dielectric cracking beginning in the second dielectric under the solder ball or other bonding conductor.

An example stress distribution pattern for UBM pads 102, including pads 108, 110, and 112, on a WCSP die 100 is shown in FIG. 1. As a result of the various forces described above, the amount of physical stress on each of the UBM pads 102 on WCSP die 100 can vary. The Inventors have found that the stress in WCSP die 100, is generally radial in nature, due to the increased amount of bowing along the edges of the WCSP die 100. Therefore, as the distance between a UBM pad 102 and the NSP 106 (shown by an "X") of the WCSP die 100 increases, the stress on the UBM pads 102 can also increase. However, the stress pattern is not necessarily uniform across the WCSP die 100. For example, the stress pattern can be minimal in a central region 104 of the WCSP die 100. This minimal stress is typically associated with the UBM pads 102 closest to the NSP 106 (i.e., UBM pads 102 having a lower distance to the NSP 106) of the WCSP die 100.

A NSP of an IC die as used herein refers to the point in which the stress is minimized or is zero. Typically, the NSP 106 is at or near the geometric center of the WCSP die 100. In some cases, the NSP 106 can offset from the geometric center of the WCSP die 100 based on the number, type, and pattern of layers formed on the die. For example, in the case of a functional circuit formed with high and low density regions of functional circuits, the variations in density (and therefore variations in functional circuit layers) can result in variations in die stress which can cause the NSP to be offset from the geometric center of the WCSP die 100. In another example, as the shape of the WCSP die varies, local and global variations in bowing can also offset the NSP of the WCSP die 100 from its geometric center.

A distance to the NSP, as used herein, refers to a distance from the NSP 106 to the center of a feature. In the case of overlapping and aligned features, the distance to the NSP would be the same for all features. For example, in the case of a series of concentric overlapping shapes, such as a group of concentric circular or rectangular features defining layers of vias and conductors, the distance to the NSP for each of the features is measured from the NSP 106 to the geometric center of the features. However in some cases, the shapes may not be concentric. In such cases, the distance to the NSP for each of the features is measured from the geometric center of each feature. However, a number of related features can be formed in a layer and be associated with a single feature. For example, two or more vias can be used to connect two pads in different layers. In such cases, the multiple vias can be considered to comprise a single feature and thus the distance to the NSP can be measured from the geometric center of the vias.

While the overall distance to the NSP 106 of the UBM pads 102 is generally the primary factor affecting reliability, is may not be the only factor. For example, in a typical die, the stress in UBM pad 108 will generally be less that in UBM pad 110. The Inventors have found that for UBM pads formed closer to the corners of the die, such as UBM pad 110, the stress is generally further enhanced, resulting in a greater likelihood of failures. Additionally, the stress can also be further enhanced for UBM pads having the same distance to the NSP due to other effects. For example, variations in functional circuit density, as described above, can also result in local variations in the radial stress pattern. In another example, variations in WCSP die size and shape can also result in variations in stress.

Figure 2A:
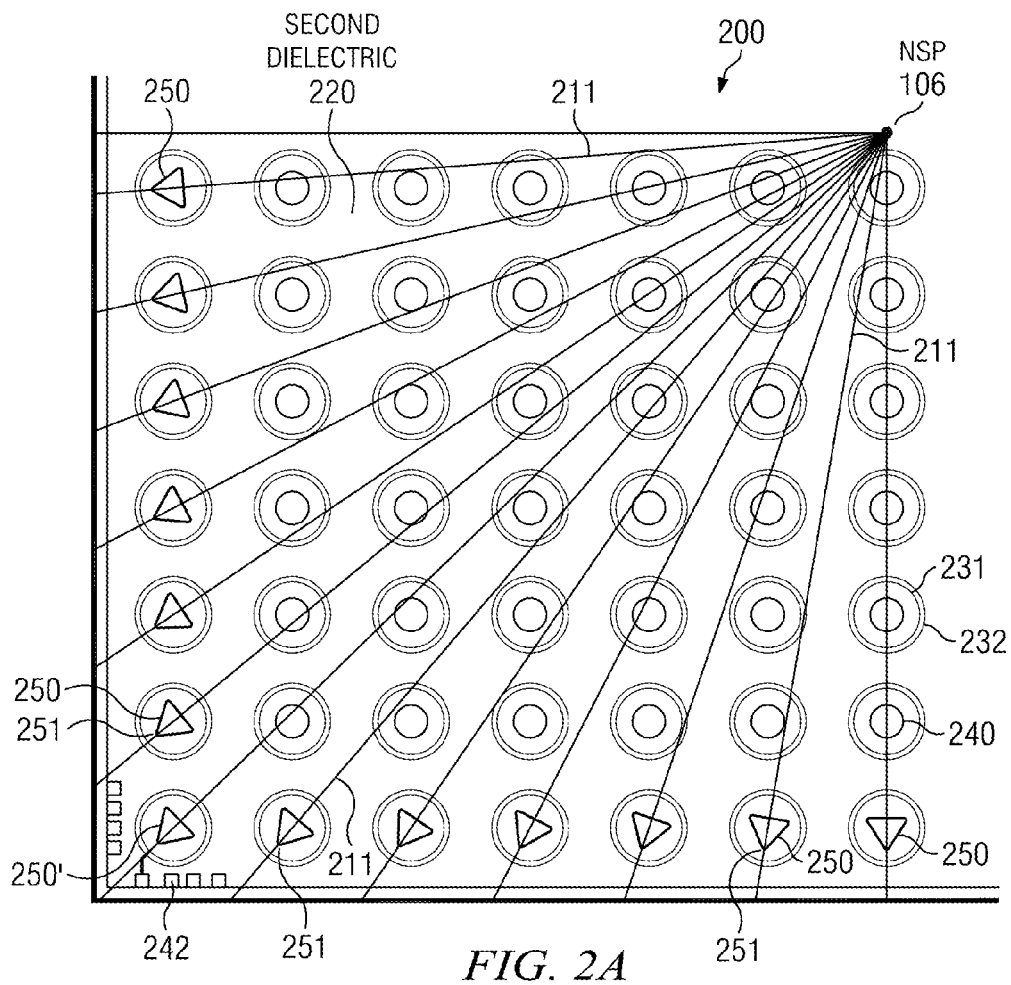
FIG. 2A shows a depiction of an example WCSP die portion having triangular crack arrest vias along the outermost rows and columns of the WCSP die, according to a disclosed embodiment.

FIG. 2A shows a depiction of an example WCSP die portion (a die quadrant) 200 having triangular crack arrest vias 250 in the second dielectric layer 220 along its outermost rows and columns, according to a disclosed embodiment. The other vias shown on WCSP die portion 200 are conventional circular vias 240. The particular one of the crack arrest vias 250 shown in the corner of WCSP die portion 200 is numbered 250'. The triangle via shapes are depicted as equilateral triangles (i.e., all three sides having the same length).

The rings beyond the crack arrest vias represent a UBM pad 231 and an RDL pad 232 under the UBM pad 231, respectively. Die pads 242 are also shown. The center of the die corresponding to WCSP die portion 200 is shown and for simplicity is assumed to be the NSP 106 on the die. Lines 211 are shown from the NSP 106 to the triangular crack arrest vias 250 and 250'.

These triangular crack arrest vias 250 and 250' can be seen to be oriented such that one of their apexes shown as 251 faces away from the NSP 106 and is oriented along the line 211 from the NSP 106 to the triangular crack arrest via to face along the line, or more generally be in a range of ±30 degrees from the line. This orientation of apex 251 has been found to laterally deflect away the reduced number of cracks in the second dielectric that do form from propagating vertically downward toward the RDL pad 232 which is under each of the crack arrest vias 250 and 250' (and vias 240). Moreover, this orientation is such that the apex 251 is at the highest stress point for the triangular crack arrest vias 250 since its distance to the NSP 106 is the highest of any edge portion of the triangular crack arrest vias 250 and 250'.

Figure 2B:
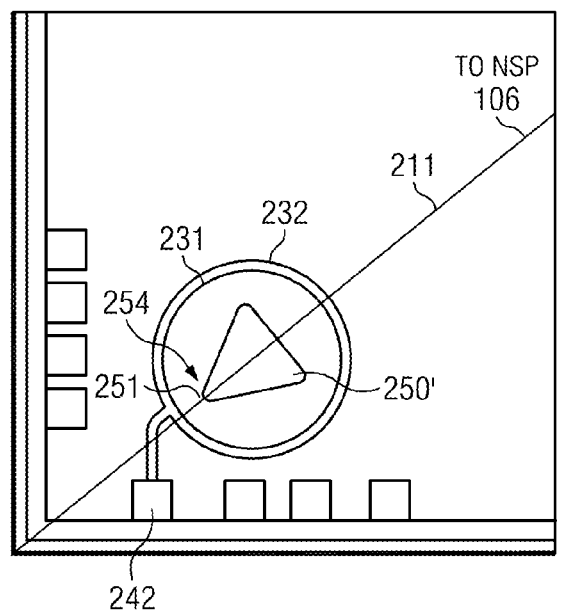
FIG. 2B shows a depiction an example triangular crack arrest via having an apex that faces away from a line to the NSP of the die, according to a disclosed embodiment.

FIG. 2B shows an expanded depiction of the example triangular crack arrest via 250' in the corner of WCSP die portion 200 shown in FIG. 2A having one of its apex 251 face away from the NSP 106 of the die and be aligned along the line from the NSP 106 to the triangular crack arrest via 250' to face in a range ±30 degrees from the line, according to a disclosed embodiment. Rounded via corners 254 are shown. As used herein a "rounded corner" is defined as a curved contour that connects adjacent legs of a triangular via in which the curved contour subtends a central angle of at least 30 degrees. Rounded corners have been found by the Inventors to further reduce cracking by reducing stress concentrations as compared to stress generated by pointed regions.

Example triangular crack arrest vias 250 also provides a reduction in incidence/density and size in second dielectric cracking/cracks due to more second dielectric between the RDL and the UBM as compared to convention circular vias. Disclosed triangular crack arrest vias 250 can reduce total via area by about 40% as compared to conventional circular vias having the same radius and as a result can provide up to about 40% more dielectric material as compared to conventional circular vias which significantly lowers the overall stress profile due to more second dielectric material being between the bonding connector (e.g., solder ball) and the RDL pad.

Figure 3:
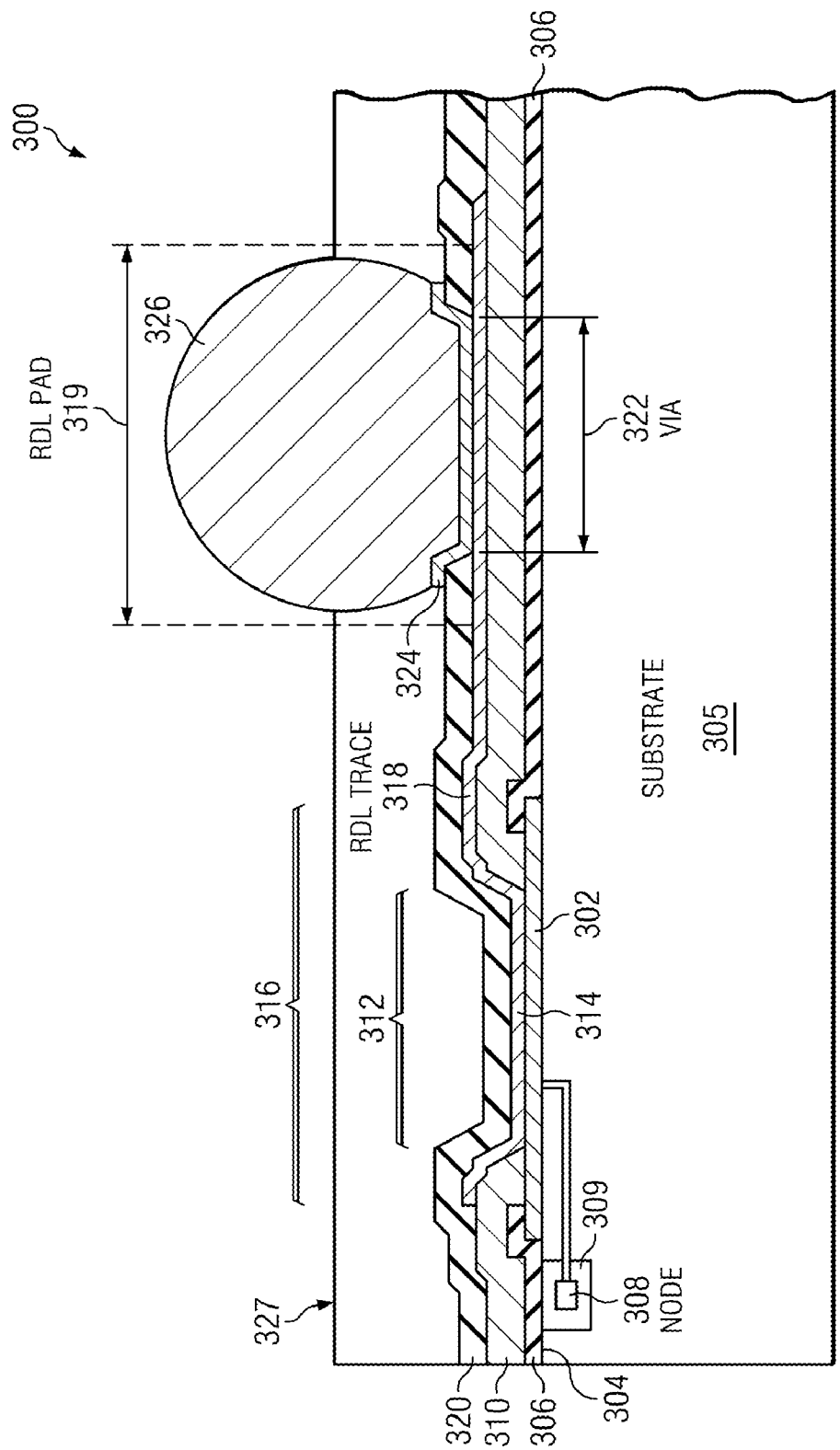
FIG. 3 shows a cross-section view of a portion of an example WCSP die having crack arrest vias according to a disclosed embodiment.

FIG. 3 shows a cross-section view of a portion of an example IC device 300 having crack arrest vias according to a disclosed embodiment. IC device 300 includes a substrate 305 having a top surface 304 including active circuitry 309 including a plurality of I/O nodes with node 308 shown, and a plurality of die pads 302 coupled to the plurality of I/O nodes. A first dielectric layer 306 includes first dielectric vias 312 over the die pad 302. An RDL 314 includes a die pad contacting pad 316, RDL traces including RDL trace 318, and a plurality of RDL capture pads with RDL capture pad 319 shown coupled to die pad 302 over first dielectric via 312 by RDL trace 318. A second dielectric layer 320 includes second dielectric vias 322 over the plurality of RDL capture pads including RDL pad 319. The second dielectric via 322 shown comprises a disclosed crack arrest via, such as triangular crack arrest vias 250 or 250' shown in FIGS. 2A and 2B.

Under bump metallization (UBM) pads 324 are coupled to the plurality of RDL capture pads including RDL pad 319 over the second dielectric vias 322. A metal bonding connector 326 shown as a solder ball is on the UBM pad 324. Although the bonding connector 326 is shown a solder ball, bonding connectors for disclosed embodiment can comprise other bonding connectors, such as pillars (e.g. copper pillars), through substrate vias, and studs (e.g., gold studs). In one embodiment the first dielectric layer and second dielectric layer both comprise a polyimide or benzocyclobutene (BCB), and the RDL comprises copper. A covering dielectric film 327 shown in FIG. 3 can be formed over the second dielectric layer 320.

FIG. 4 shows empirical results evidencing BLR improvements in TC performance for WCSP die having disclosed crack arrest vias compared to conventional circular vias, according to disclosed embodiments. TC testing was performed from −40 to 125° C., with the WCSP die bonded to a FR4 (organic) substrate. Disclosed crack arrest vias can be seen to provide a 177% improvement in BLR-TC performance (WCSP die on organic substrate) based on a 5% failure rate as compared to a conventional WCSP die that includes conventional circular second dielectric vias.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An integrated circuit (IC) device, comprising:
a substrate having a top surface including active circuitry including a plurality of input/output (I/O) nodes, and a plurality of die pads coupled to said plurality of I/O nodes;
a first dielectric layer including first dielectric vias over said plurality of die pads;
a redirect layer (RDL) including a plurality of RDL capture pads coupled to said plurality of die pads over said first dielectric vias;
a second dielectric layer including second dielectric vias over said plurality of RDL capture pads, wherein at least one of said second dielectric vias is a crack arrest via that has a via shape that includes an apex that faces away from a neutral stress point of said IC die and is oriented along a line from said neutral stress point to said crack arrest via to face in a range of ±30 degrees from said line;
under bump metallization (UBM) pads coupled to said plurality of RDL capture pads over said second dielectric vias, and
metal bonding connectors on said UBM pads.

2. The IC device of claim 1, wherein said apex is oriented to face in a range of ±15 degrees from said line.

3. The IC device of claim 1, wherein said via shape for said crack arrest via is triangular including rounded corners.

4. The IC device of claim 1, wherein said at least one crack arrest via comprises a plurality of crack arrest vias that are provided for all of said second dielectric vias along outermost periphery rows and columns of said IC device.

5. The IC device of claim 1, wherein said plurality of crack arrest vias are provided for all of said second dielectric vias along three outermost rows and columns of said IC device including said outer periphery rows and columns of said IC device.

6. The IC device of claim 1, wherein said metal bonding connectors comprise solder balls.

7. The IC device of claim 1, wherein said first dielectric layer and said second dielectric layer both comprise a polyimide or benzocyclobutene (BCB), and said RDL comprises copper.

8. The IC device of claim 1, wherein said IC device comprises a wafer chip scale package (WCSP).

9. An integrated circuit (IC) device, comprising:
a substrate having a top surface including active circuitry including a plurality of input/output I/O nodes, and a plurality of die pads coupled to said plurality of I/O nodes;
a first dielectric layer including first dielectric vias over said plurality of die pads;
a redirect layer (RDL) including a plurality of RDL capture pads coupled to said plurality of die pads over said first dielectric vias;
a second dielectric layer including second dielectric vias over said plurality of RDL capture pads, wherein at least one of said second dielectric vias is a crack arrest via that has a via shape that includes an apex that faces away from a neutral stress point of said IC die and is oriented along a line from said neutral stress point to said crack arrest via to face in a range of ±15 degrees from said line;
under bump metallization (UBM) pads coupled to said plurality of RDL capture pads over said second dielectric vias;
metal bonding connectors on said UBM pads;
wherein said via shape for said crack arrest via is triangular including rounded corners, and
wherein said at least one crack arrest via comprises a plurality of crack arrest vias that are provided for all of said second dielectric vias along outermost periphery rows and columns of said IC device.

* * * * *